United States Patent [19]

Moy

[11] Patent Number: 5,187,388
[45] Date of Patent: Feb. 16, 1993

[54] COMBINED CIRCUIT CONFIGURATION FOR A CMOS LOGIC INVERTER AND GATE

[75] Inventor: Thomas H. Moy, Boise, Id.
[73] Assignee: Micron Technology, Inc., Boise, Id.
[21] Appl. No.: 781,487
[22] Filed: Oct. 21, 1991
[51] Int. Cl.[5] ............................................. H03K 19/20
[52] U.S. Cl. .................................. 307/448; 307/451; 307/445
[58] Field of Search ........................ 307/448, 451, 445

[56] References Cited

U.S. PATENT DOCUMENTS

| | | | |
|---|---|---|---|
| 4,649,296 | 3/1987 | Shoji | 307/451 |
| 4,758,744 | 7/1988 | Plus | 307/451 |
| 4,999,529 | 3/1991 | Morgan, Jr. et al. | 307/488 |

Primary Examiner—Edward P. Westin
Assistant Examiner—Andrew Sanders
Attorney, Agent, or Firm—Marger, Johnson, McCollom & Stolowitz

[57] ABSTRACT

A combined logic circuit includes an inverter and a logic gate that share a common first logic signal. The inverter has an input for receiving the first logic signal and an output for providing an inverted first logic signal. The logic gate has a first input for receiving the first logic signal and two or more secondary inputs for receiving secondary logic signals. The logic gate also includes first and second power supply nodes. The first power supply node receives the inverted first logic signal, thus actively controlling the logic function of the gate as well as eliminating a separate inverting transistor, while the second power supply node normally receives a power supply voltage. The output of the logic gate provides a predetermined logic function of the first and secondary logic signals that is equivalent to the prior art circuit. The combined logic inversion and predetermined logic function are accomplished with one less transistor than prior art circuits.

15 Claims, 3 Drawing Sheets

COMBINED CIRCUIT CONFIGURATION FOR A CMOS LOGIC INVERTER AND GATE

BACKGROUND OF THE INVENTION

This invention relates generally to CMOS logic circuits, and more particularly, to a combined circuit configuration for a CMOS logic inverter and multi input logic gate.

A typical combined CMOS circuit 10 implementing an inverter and a two input NAND gate having a common input is shown in FIG. 1. P-channel transistor M1 and N-channel transistor M2 form an inverter. The coupled gates of transistors M1 and M2 form the input at circuit node 12, which receives logic signal A. The coupled drains of transistors M1 and M2 form the output at circuit node 22, which provides an inverted logic signal A*. The source of transistor M1 is coupled to a first source of supply voltage, designated VDD, at circuit node 15. The source of transistor M2 is coupled to a second source of supply voltage, designated VSS, at circuit node 17. CMOS logic levels typically require a five volt VDD power supply voltage and a zero volt VSS power supply voltage. These voltage levels can change depending upon the application and feature size of the CMOS transistors used.

Transistors M3 through M6 form a NAND gate. The coupled gates of P-channel transistor M4 and N-channel transistor M6 form the first input of the NAND gate, and are coupled to circuit node 12, sharing the common logic signal A. The source of transistor M4 is coupled to power supply VDD and the drain of transistor M4 is coupled to the output of the NAND gate. The source of transistor M6 is coupled to power supply VSS and the drain of transistor M6 is coupled to the source of transistor M5. The coupled gates of P channel transistor M3 and N-channel transistor M5 form the second input of the NAND gate at circuit node 14. The second input receives a second logic signal B. The coupled drains of transistors M3 and M5 are coupled to the output of the NAND gate at circuit node 18. Six transistors are required to implement the combined inverter and NAND gate of circuit 10.

In operation, the NAND gate of FIG. 1 responds to four separate logic states to provide the logical NAND function. The logical input states, status of each transistor, and output logical level are shown below in Table One. A transistor is labeled off if the gate-to-source voltage is zero, or is prevented from conducting current due to a series transistor that is off.

TABLE 1

| A | B | M3 | M4 | M5 | M6 | Output |
|---|---|----|----|----|----|--------|
| 0 | 0 | on | on | off | off | 1 |
| 0 | 1 | off | on | off | off | 1 |
| 1 | 0 | on | off | off | off | 1 |
| 1 | 1 | off | off | on | on | 0 |

A typical combined CMOS circuit 30 implementing an inverter and a two input NOR gate having a common input is shown in FIG. 3. The inverter is identical to the inverter of circuit 10. The inverter and the NOR gate have a common input for receiving logic signal A on circuit node 12.

Transistors M3 through M6 form the NOR gate. The coupled gates of P-channel transistor M3 and N-channel transistor M6 form the first input of the NOR gate at circuit node 12, which receives the first logic signal A. The coupled gates of P-channel transistor M4 and N-channel transistor M5 form the second input of the NOR gate at circuit node 14, which receives the second logic signal B. The coupled drains of transistors M4 and M6 are coupled to the output of the NOR gate at circuit node 18. The source of transistor M4 is coupled to the drain of transistor M3. The source of transistor M3 is coupled to supply voltage VDD and the source of transistors M5 and M6 are coupled to supply voltage VSS. The drain of transistor M6 is coupled to the output of the NOR gate. Six transistors are also required to implement the combined inverter and NOR gate of circuit 30.

In operation, the NOR gate of FIG. 3 also responds to four separate logic states to provide the logical NOR function. The logical input states, status of each transistor, and output logical level are shown below in Table Two. A transistor is labeled off if the gate-to-source voltage is zero, or is prevented from conducting current due to a series transistor that is off.

TABLE 2

| A | B | M3 | M4 | M5 | M6 | Output |
|---|---|----|----|----|----|--------|
| 0 | 0 | on | on | off | off | 1 |
| 0 | 1 | off | off | on | off | 0 |
| 1 | 0 | off | off. | off | on | 0 |
| 1 | 1 | off | off | on | on | 0 |

A typical combined CMOS circuit 50 implementing an inverter and a three input NAND gate having a common input is shown in FIG. 5. The inverter is identical to the inverter of circuit 10. The inverter and the NOR gate have a common input for receiving logic signal A on circuit node 12.

Transistors M3 through M8 form the NAND gate. The coupled gates of P channel transistor M5 and N-channel transistor M8 form the first input of the NAND gate at circuit node 12, which receives the first logic signal A. The coupled gates of P-channel transistor M3 and N-channel transistor M6 form the second input of the NAND gate at circuit node 14, which receives the second logic signal B. The coupled gates of P-channel transistor M4 and N-channel transistor M7 form the third input of the NAND gate at circuit node 16, which receives the third logic signal C. The coupled drains of transistors M3 through M6 are coupled to the output of the NAND gate at circuit node 18. The drain of transistor M8 is coupled to the source of transistor M7, and the drain of transistor M7 is coupled to the source of transistor M6. The source of transistors M3 through M5 are coupled to supply voltage VDD and the source of transistor M8 is coupled to supply voltage VSS. A total of eight transistors is required to implement the combined inverter and three input NAND gate of circuit 50.

In operation, the NAND gate of FIG. 3 also responds to eight separate logic states to provide the logical NOR function. The logical input states, status of each transistor, and output logical level are shown below in Table Three. A transistor is labeled off if the gate-to source voltage is zero, or is prevented from conducting current due to a series transistor that is off.

TABLE 3

| A | B | C | M3 | M4 | M5 | M6 | M7 | M8 | Output |
|---|---|---|----|----|----|----|----|----|--------|
| 0 | 0 | 0 | on | on | on | off | off | off | 1 |
| 0 | 0 | 1 | on | off | on | off | off | off | 1 |
| 0 | 1 | 0 | off | on | on | off | off | off | 1 |
| 0 | 1 | 1 | off | off | on | off | off | off | 1 |
| 1 | 0 | 0 | on | on | off | off | off | off | 1 |
| 1 | 0 | 1 | on | off | off | off | off | off | 1 |

TABLE 3-continued

| A | B | C | M3 | M4 | M5 | M6 | M7 | M8 | Output |
|---|---|---|-----|-----|-----|-----|-----|-----|--------|
| 1 | 1 | 0 | off | on | off | off | off | off | 1 |
| 1 | 1 | 1 | off | off | off | on | on | on | 0 |

What is desired is a combined inverter and logic gate circuit that can provide the same logic function as the prior art circuits 10, 30, and 50, as well as other similar circuits, with one less transistor, in order that integrated circuit area is conserved.

SUMMARY OF THE INVENTION

It is, therefore, an objective of the invention to provide a combined inverter and logic gate circuit.

Another object of the invention is to provide a CMOS logic circuit having one less transistor than prior art circuits while maintaining the same logic function.

It is an advantage of the invention that integrated circuit area is conserved.

According to the present invention, a combined logic circuit includes an inverter and a logic gate that share a common first logic signal. The inverter has an input for receiving the first logic signal and an output for providing an inverted first logic signal. The logic gate has a first input for receiving the first logic signal and two or more secondary inputs for receiving secondary logic signals. The logic gate also includes first and second power supply nodes. The first power supply node receives the inverted first logic signal, thus actively controlling the logic function of the gate as well as eliminating a separate inverting transistor, while the second power supply node normally receives a power supply voltage. The output of the logic gate provides a predetermined logic function of the first and secondary logic signals that is equivalent to the prior art circuit. Thus, the combined logic inversion and predetermined logic function are accomplished with one less transistor than prior art circuits.

In the preferred embodiment, the inverter and logic gate are fabricated using CMOS technology, including P-channel and N-channel FETs. The logic gate can be configured to provide both NAND and NOR logic functions.

The foregoing and other objects, features and advantages of the invention will become more readily apparent from the following detailed description of a preferred embodiment of the invention which proceeds with reference to the accompanying drawings.

DETAILED DESCRIPTION

Figure 1:
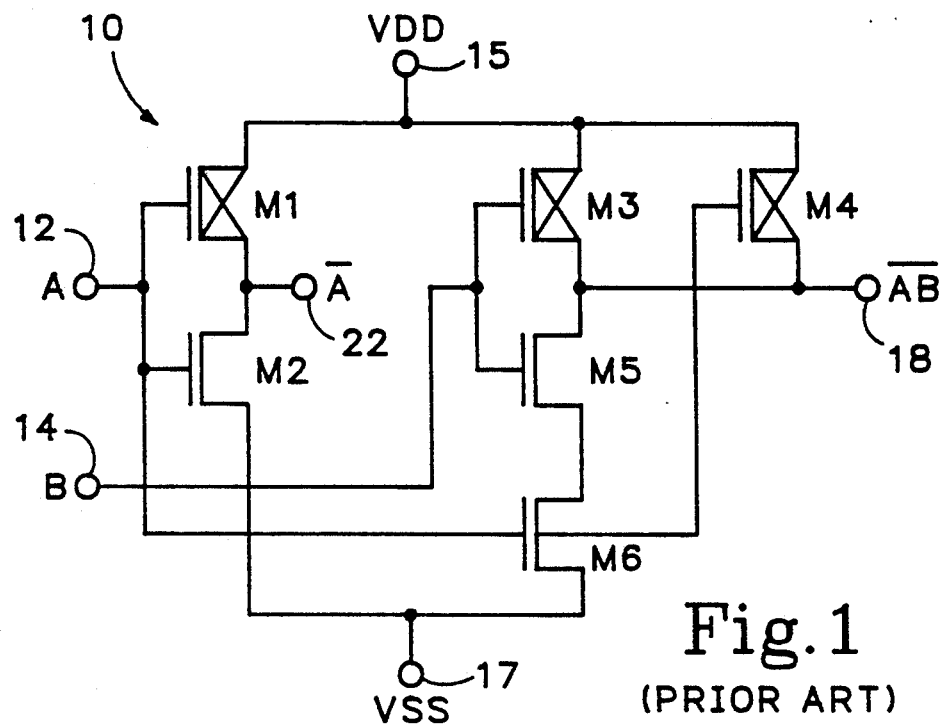
FIGS. 1, 3, and 5 are schematic diagrams of prior art logic circuits combining an inverter and a logic gate.
Figure 2:
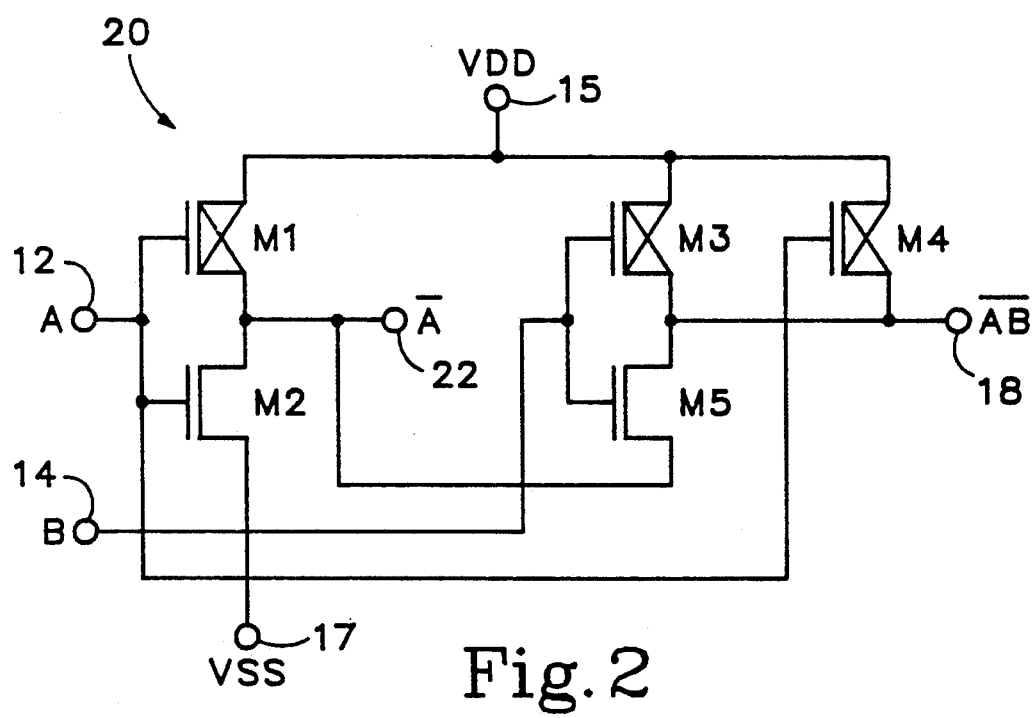
FIGS. 2, 4, and 6 are schematic diagrams of equivalent combined logic circuits according to the present invention respectively corresponding to the circuits of FIGS. 1, 3 and 5.
Figure 3:
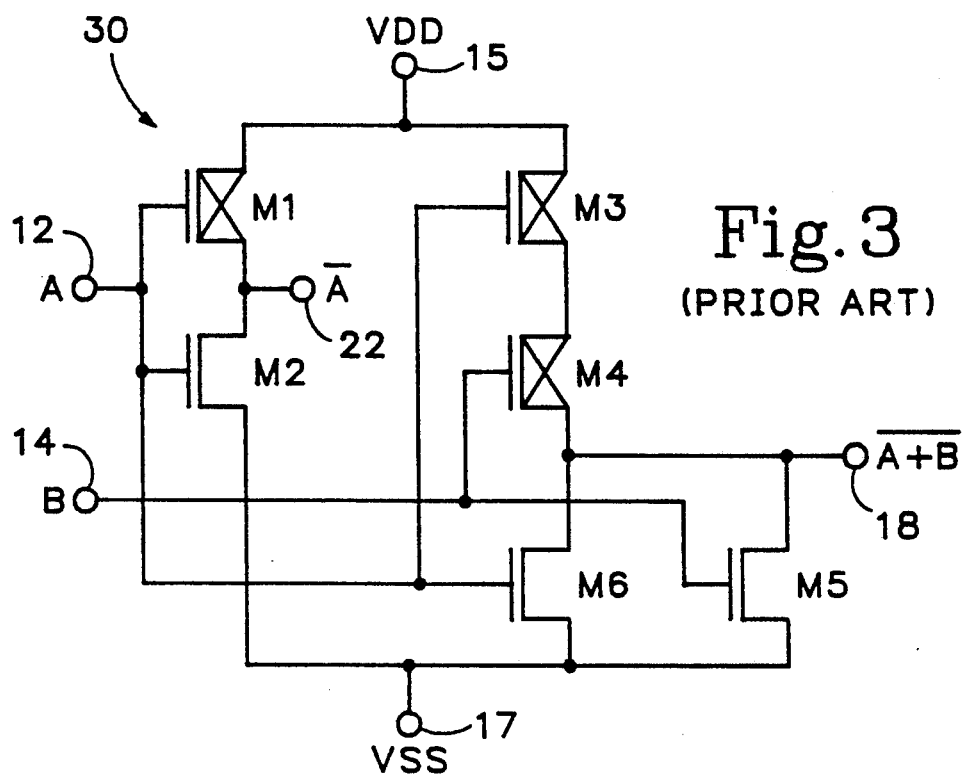
Figure 4:
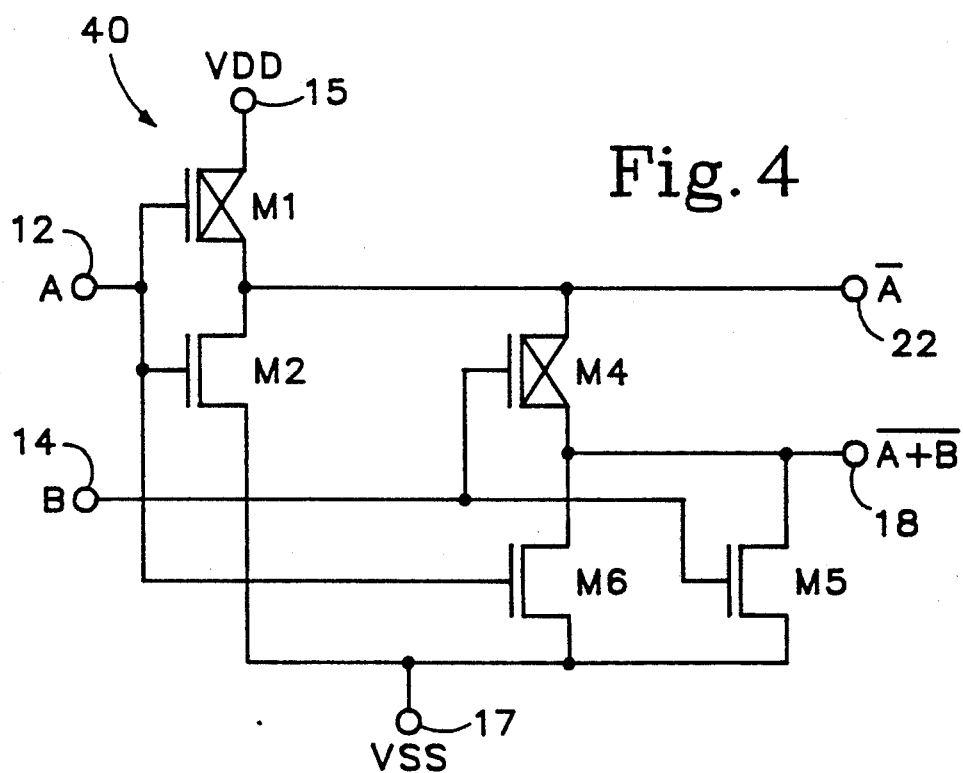
Figure 5:
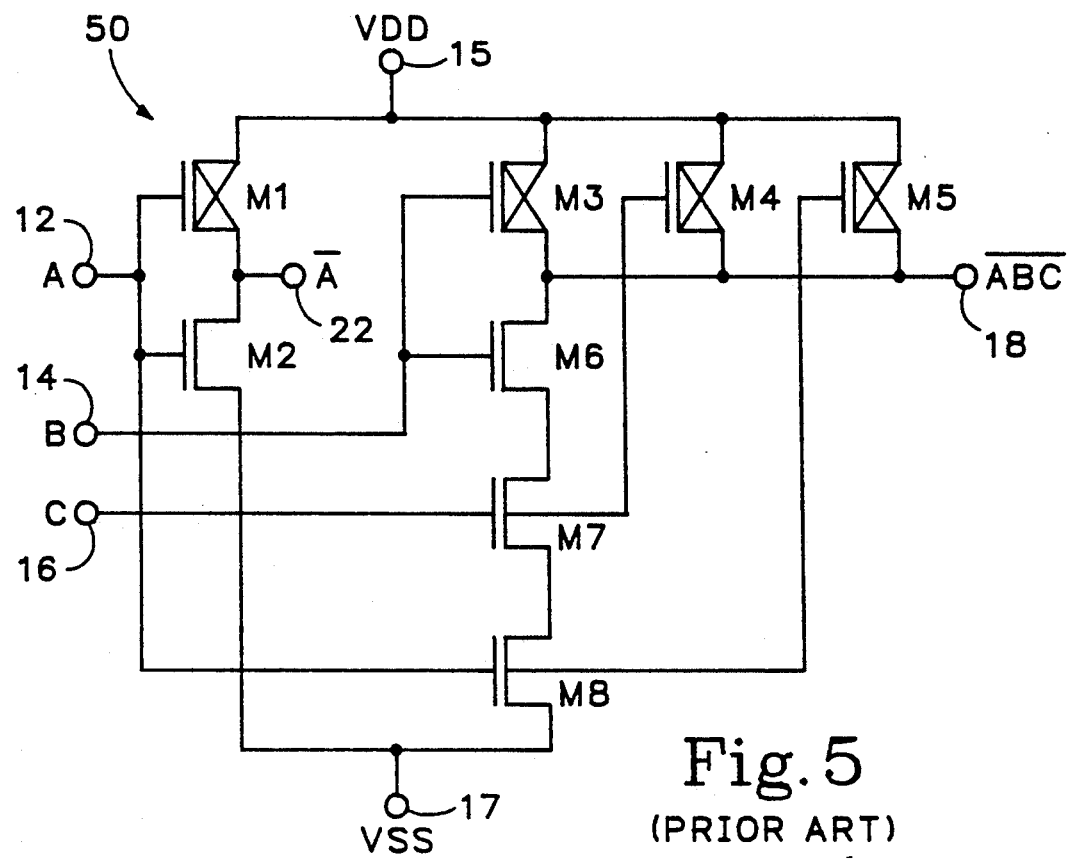
Figure 6:
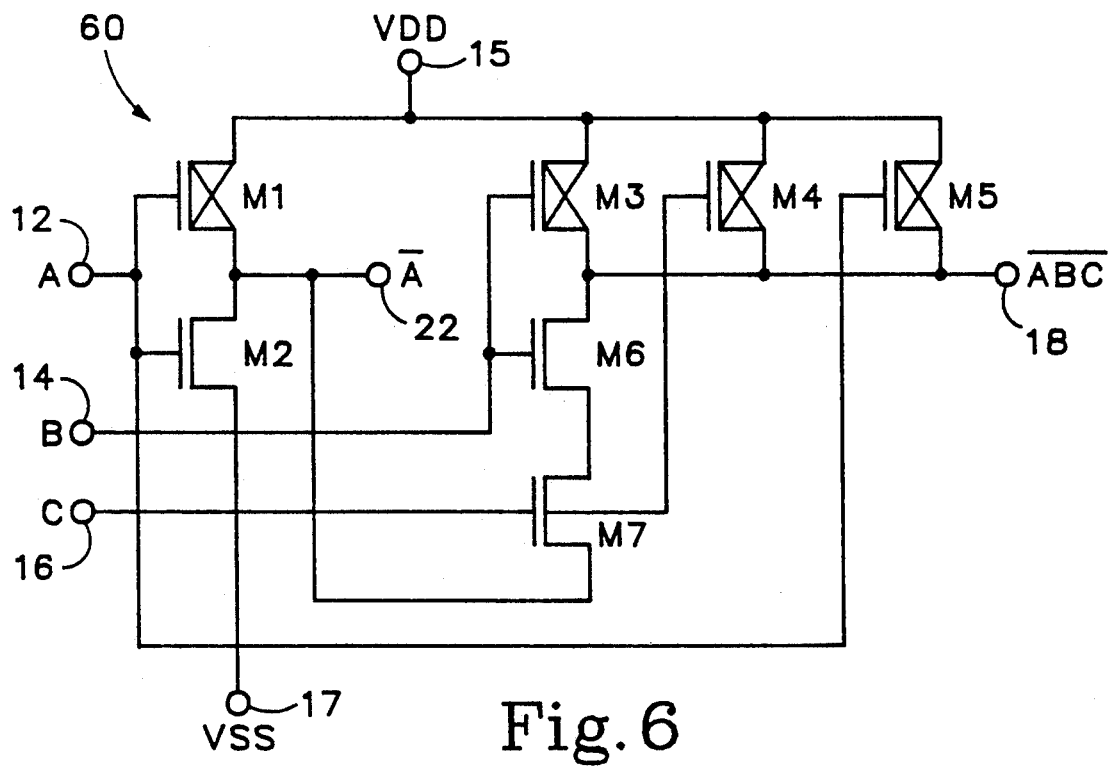

The description of the present invention proceeds with three illustrative circuit examples shown in FIGS. 2, 4, and 6 corresponding to the prior art circuit examples shown in FIGS. 1, 3, and 5.

A combined CMOS circuit 20 implementing an inverter and a two input NAND gate having a common input according to the present invention is shown in FIG. 2. The configuration of the circuit is similar to the prior art circuit 10 of FIG. 1, with the exception that transistor M6 is eliminated and the output of the inverter, which can also be used for other purposes, is coupled to the source of transistor M5.

Transistors M3 through M5 form the NAND gate. Only five transistors are required to implement the combined inverter and NAND gate of circuit 20.

In operation, the NAND gate of FIG. 1 responds to four separate logic states to provide the logical NAND function. The logical input states, status of each transistor, and output logical level are shown below in Table Four. A transistor is labeled off if the gate-to-source voltage is zero, or is prevented from conducting current due to a series transistor that is off. Note that transistor M5 can be turned off either by taking the gate to a logic zero, or by taking the source to a logic one.

TABLE 4

| A | A* | B | M3 | M4 | M5 | Output |
|---|----|---|-----|-----|-----|--------|
| 0 | 1 | 0 | on | on | off | 1 |
| 0 | 1 | 1 | off | on | off | 1 |
| 1 | 0 | 0 | on | off | off | 1 |
| 1 | 0 | 1 | off | off | on | 0 |

A combined CMOS circuit 40 implementing an inverter and a two input NOR gate having a common input according to the present invention is shown in FIG. 4. The configuration of the circuit is similar to the prior art circuit 30 of FIG. 3, with the exception that transistor M3 is eliminated and the output of the inverter is coupled to the source of transistor M4.

Transistors M4 through M6 form the NOR gate. Only five transistors are required to implement the combined inverter and NOR gate of circuit 40.

In operation, the NOR gate of FIG. 4 also responds to four separate logic states to provide the logical NOR function. The logical input states, status of each transistor, and output logical level are shown below in Table Five. A transistor is labeled off if the gate-to-source voltage is zero, or is prevented from conducting current due to a series transistor that is off. Note that transistor M4 can be turned off either by taking the gate to a logic one, or by taking the source to a logic zero.

TABLE 5

| A | A* | B | M4 | M5 | M6 | Output |
|---|----|---|-----|-----|-----|--------|
| 0 | 1 | 0 | on | off | off | 1 |
| 0 | 1 | 1 | off | on | off | 0 |
| 1 | 0 | 0 | off | off | on | 0 |
| 1 | 0 | 1 | off | on | on | 0 |

A combined CMOS circuit 60 implementing an inverter and a three input NAND gate having a common input according to the present invention is shown in FIG. 6. The configuration of the circuit is similar to the prior art circuit 50 of FIG. 5, with the exception that transistor M8 is eliminated and the output of the inverter is coupled to the source of transistor M7.

Transistors M3 through M7 form the three input NAND gate. Only seven transistors are required to implement the combined inverter and three input NAND gate of circuit 60.

In operation, the NAND gate of FIG. 6 also responds to eight separate logic states to provide the logical NOR function. The logical input states, status of each transistor, and output logical level are shown below in Table Six. A transistor is labeled off if the gate-to-source voltage is zero, or is prevented from conducting current due to a series transistor that is off. Note that transistor M7 can be turned off either by taking the gate to a logic zero, or by taking the source to a logic one.

TABLE 6

| A | A* | B | C | M3 | M4 | M5 | M6 | M7 | Output |
|---|----|---|---|----|----|----|----|----|--------|
| 0 | 1 | 0 | 0 | on | on | on | off | off | 1 |
| 0 | 1 | 0 | 1 | on | off | on | off | off | 1 |
| 0 | 1 | 1 | 0 | off | on | on | off | off | 1 |
| 0 | 1 | 1 | 1 | off | off | on | off | off | 1 |
| 1 | 0 | 0 | 0 | on | on | off | off | off | 1 |
| 1 | 0 | 0 | 1 | on | off | off | off | off | 1 |
| 1 | 0 | 1 | 0 | off | on | off | off | off | 1 |
| 1 | 0 | 1 | 1 | off | off | off | on | on | 0 |

Having described and illustrated the principles of the invention in a preferred embodiment thereof, it is apparent to those skilled in the art that the invention can be modified in arrangement and detail without departing from such principles. For example, the drawing figures are only meant to be illustrative of the many types of gates that can be combined with an inverter having a common input. Any type of two or multiple input OR, NOR, XOR, or XNOR prior gate can be modified in the manner described to eliminate a transistor. I therefore claim all modifications and variation coming within the spirit and scope of the following claims.

I claim:

1. A logic circuit (20) comprising:
   an inverter (M1-M2) having an input for receiving a first logic signal and an output for providing an inverted first logic signal; and
   a logic gate (M3-M5, M4-M6) having a first input for receiving the first logic signal, a second input for receiving a second logic signal, a first power supply node for receiving the inverted first logic signal, a second power supply node for receiving a power supply voltage, and an output for providing a logical function of the first and second logic signals, wherein the logic gate includes
   a first transistor (M3) of a first polarity type having a gate coupled to the second input, a drain coupled to the output, and a source coupled to the second power supply node;
   a second transistor (M4) of a first polarity type having a gate coupled to the first input, a drain coupled to the output, and a source coupled to the second power supply node; and
   a third transistor (M5) of a second polarity type having a gate coupled to the second input, a drain coupled to the output, and a source coupled to the first power supply node.

2. A logic circuit as in claim 1 in which the first and second transistors each comprise a P-channel FET, and the third transistor comprises an N-channel FET.

3. A logic circuit (40) comprising:
   an inverter (M1-M2) having an input for receiving a first logic signal and an output for providing an inverted first logic signal; and
   a logic gate (M3-M5, M4-M6) having a first input for receiving the first logic signal, a second input for receiving a second logic signal, a first power supply node for receiving the inverted first logic signal, a second power supply node for receiving a power supply voltage, and an output for providing a logical function of the first and second logic signals, wherein the logic gate includes
   a first transistor (M4) of a first polarity type having a gate coupled to the second input, a drain coupled to the output, and a source coupled to the first power supply node;
   a second transistor (M5) of a second polarity type having a gate coupled to the second input, a drain coupled to the output, and a source coupled to the second power supply node; and
   a third transistor (M6) of a second polarity type having a gate coupled to first input, a drain coupled to the output, and a source coupled to the second power supply node.

4. A logic circuit (60) comprising:
   an inverter (M1-M2) having an input for receiving a first logic signal and an output for providing an inverted first logic signal; and
   a logic gate (M3-M7) having a first input for receiving the first logic signal, a second input for receiving a second logic signal, a third input for receiving a third logic signal, a first power supply node for receiving the inverted first logic signal, a second power supply node for receiving a power supply voltage, and an output for providing a logical function of the first, second, and third logic signals.

5. A logic circuit as in claim 4 in which the logical function comprises the logical NAND function.

6. A logic circuit as in claim 4 in which the inverter comprises a CMOS inverter.

7. A logic circuit as in claim 4 in which the logic gate comprises:
   a first transistor (M3) of a first polarity type having a gate coupled to the second input, a drain coupled to the output, and a source coupled to the second power supply node;
   a second transistor (M4) of a first polarity type having a gate coupled the third input, a drain coupled to the output, and a source coupled to the second power supply node;
   a third transistor (M5) of a first polarity type having a gate coupled to the first input, a drain coupled to the output, and a source coupled to the second power supply node;
   a fourth transistor (M6) of a second polarity type having a gate coupled to the second input, a drain coupled to the output, and a source; and
   a fifth transistor (M7) of a second polarity type having a gate coupled to the third input, a drain coupled to the source of the fourth transistor, and a source coupled to the first power supply node.

8. A logic circuit as in claim 7 in which the first, second, and third transistors each comprise a P-channel FET, and the fourth and fifth transistors each comprise an N-channel FET.

9. A logic circuit (60) comprising:
   an inverter (M1-M2) having an input for receiving a first logic signal and an output for providing an inverted first logic signal; and
   a logic gate (M3-M7) having a first input for receiving the first logic signal, a plurality of secondary inputs for receiving a plurality of secondary logic signals, a first power supply node for receiving the inverted first logic signal, a second power supply node for receiving a power supply voltage, and an output for providing a logical function of the first and secondary logic signals.

10. A method of inverting a first logic signal and logically combining the first logic signal with a plurality of secondary logic signals, the method comprising the steps of:
    providing an inverter having an input and an output;

providing a logic gate having a plurality of inputs, first and second power supply nodes, and an output for providing a predetermined logical combination of the first and secondary logic signals;

coupling the first logic signal to the inverter input and a first input of the logic gate;

coupling the secondary logic signals to corresponding inputs of the logic gate;

coupling the first power supply node of the logic gate to the inverter output; and coupling the second power supply node of the logic gate to a source of supply voltage.

11. The method of claim 10 further comprising the step of configuring the logic gate to provide a logical NAND function.

12. A logic circuit (20, 40) comprising:

an inverter (M1-M2) having an input for receiving a first logic signal and an output for providing an inverted first logic signal; and a logic gate (M3-M5, M4-M6) having a first input for receiving the first logic signal, a second input for receiving a second logic signal, a first power supply node for receiving the inverted first logic signal, a second power supply node for receiving a power supply voltage, and an output for providing a logical NAND function of the first and second logic signals.

13. A logic circuit (20, 40) comprising:

an inverter (M1-M2) having an input for receiving a first logic signal and an output for providing an inverted first logic signal; and a logic gate (M3-M5, M4-M6) having a first input for receiving the first logic signal, a second input for receiving a second logic signal, a first power supply node for receiving the inverted first logic signal, a second power supply node for receiving a power supply voltage, and an output for providing a logical NOR function of the first and second logic signals.

14. A method of inverting a first logic signal and logically combining the first logic signal with a second logic signal, the method comprising the steps of:

providing an inverter having an input and an output;

providing a logic gate having first and second inputs, first and second power supply nodes, and an output for providing a logical NAND combination of the first and second logic signals;

coupling the first logic signal to the inverter input and the first input of the logic gate;

coupling the second logic signal to the second input of the logic gate;

coupling the first power supply node of the logic gate to the inverter output; and coupling the second power supply node of the logic gate to a source of supply voltage.

15. A method of inverting a first logic signal and logically combining the first logic signal with a second logic signal, the method comprising the steps of:

providing an inverter having an input and an output;

providing a logic gate having first and second inputs, first and second power supply nodes, and an output for providing a logical NOR combination of the first and second logic signals;

coupling the first logic signal to the inverter input and the first input of the logic gate;

coupling the second logic signal to the second input of the logic gate;

coupling the first power supply node of the logic gate to the inverter output; and coupling the second power supply node of the logic gate to a source of supply voltage.

* * * * *

UNITED STATES PATENT AND TRADEMARK OFFICE
CERTIFICATE OF CORRECTION

PATENT NO. : 5,187,388
DATED : February 16, 1993
INVENTOR(S) : Thomas H. Moy

It is certified that error appears in the above-indentified patent and that said Letters Patent is hereby corrected as shown below:

Column 2, line 54, delete "3" and insert --5--.

Column 4, line 7, delete "1" and insert --2--.

Signed and Sealed this

Fourteenth Day of December, 1993

Attest:

BRUCE LEHMAN

*Attesting Officer*  *Commissioner of Patents and Trademarks*